United States Patent
Huang et al.

(10) Patent No.: US 10,163,882 B2
(45) Date of Patent: Dec. 25, 2018

(54) SEMICONDUCTOR DEVICE AND LAYOUT THEREOF

(71) Applicant: TAIWAN SEMICONDUCTOR MANUFACTURING CO., LTD., Hsinchu (TW)

(72) Inventors: Cheng-I Huang, Hsinchu (TW); Ting-Wei Chiang, New Taipei (TW); Shih-Chi Fu, Hsinchu County (TW); Sheng-Fang Cheng, New Taipei (TW); Jung-Chan Yang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/172,020

(22) Filed: Jun. 2, 2016

(65) Prior Publication Data

US 2017/0179105 A1    Jun. 22, 2017

Related U.S. Application Data

(60) Provisional application No. 62/268,416, filed on Dec. 16, 2015.

(51) Int. Cl.
| | |
|---|---|
| *G06F 17/50* | (2006.01) |
| *H01L 27/02* | (2006.01) |
| *H01L 29/66* | (2006.01) |
| *H01L 27/088* | (2006.01) |
| *H01L 21/8234* | (2006.01) |

(52) U.S. Cl.
CPC ...... *H01L 27/0207* (2013.01); *G06F 17/5068* (2013.01); *H01L 27/0886* (2013.01); *H01L 29/66545* (2013.01); *H01L 21/823431* (2013.01)

(58) Field of Classification Search
None
See application file for complete search history.

(56) References Cited

U.S. PATENT DOCUMENTS

| | | | |
|---|---|---|---|
| 8,110,466 B2 | 2/2012 | Shieh et al. | |
| 8,487,378 B2 | 7/2013 | Goto et al. | |
| 8,729,634 B2 | 5/2014 | Shen et al. | |
| 8,779,517 B2 | 7/2014 | Lin et al. | |
| 8,826,213 B1 | 9/2014 | Ho et al. | |
| 8,887,106 B2 | 11/2014 | Ho et al. | |
| 9,231,106 B2 | 1/2016 | Tseng et al. | |
| 9,356,046 B2 | 5/2016 | Cheng et al. | |
| 9,502,410 B1* | 11/2016 | Feng | H01L 27/0886 |
| 2012/0273747 A1 | 11/2012 | Saitoh et al. | |
| 2014/0282326 A1 | 9/2014 | Chen et al. | |

FOREIGN PATENT DOCUMENTS

| | | |
|---|---|---|
| CN | 102054705 A | 5/2011 |
| TW | 201338166 A | 9/2013 |
| TW | 201436233 A | 9/2014 |
| TW | 201521095 A | 6/2015 |

\* cited by examiner

*Primary Examiner* — Shaun M Campbell
(74) *Attorney, Agent, or Firm* — Maschoff Brennan

(57) ABSTRACT

A semiconductor device includes a substrate and fins. The fins are formed on a first area and a second area of the substrate. The first area includes a first recess. The second area is located with respect to the first area. The first recess is disposed at a side of the first area, and faces the second area. A projection area of the first recess on a side of the second area is substantially flat.

20 Claims, 12 Drawing Sheets

SEMICONDUCTOR DEVICE AND LAYOUT THEREOF

RELATED APPLICATIONS

This application claims priority to U.S. Provisional Application Ser. No. 62/268,416, filed Dec. 16, 2015, which is herein incorporated by reference.

BACKGROUND

One of the goals of the semiconductor industry is to continue shrinking the size and increasing the speed of individual field-effect transistors (FETs), which include, for example, metal oxide semiconductor (MOS) transistors. To achieve these goals, fin FETs (FinFETs) or multiple gate transistors are developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
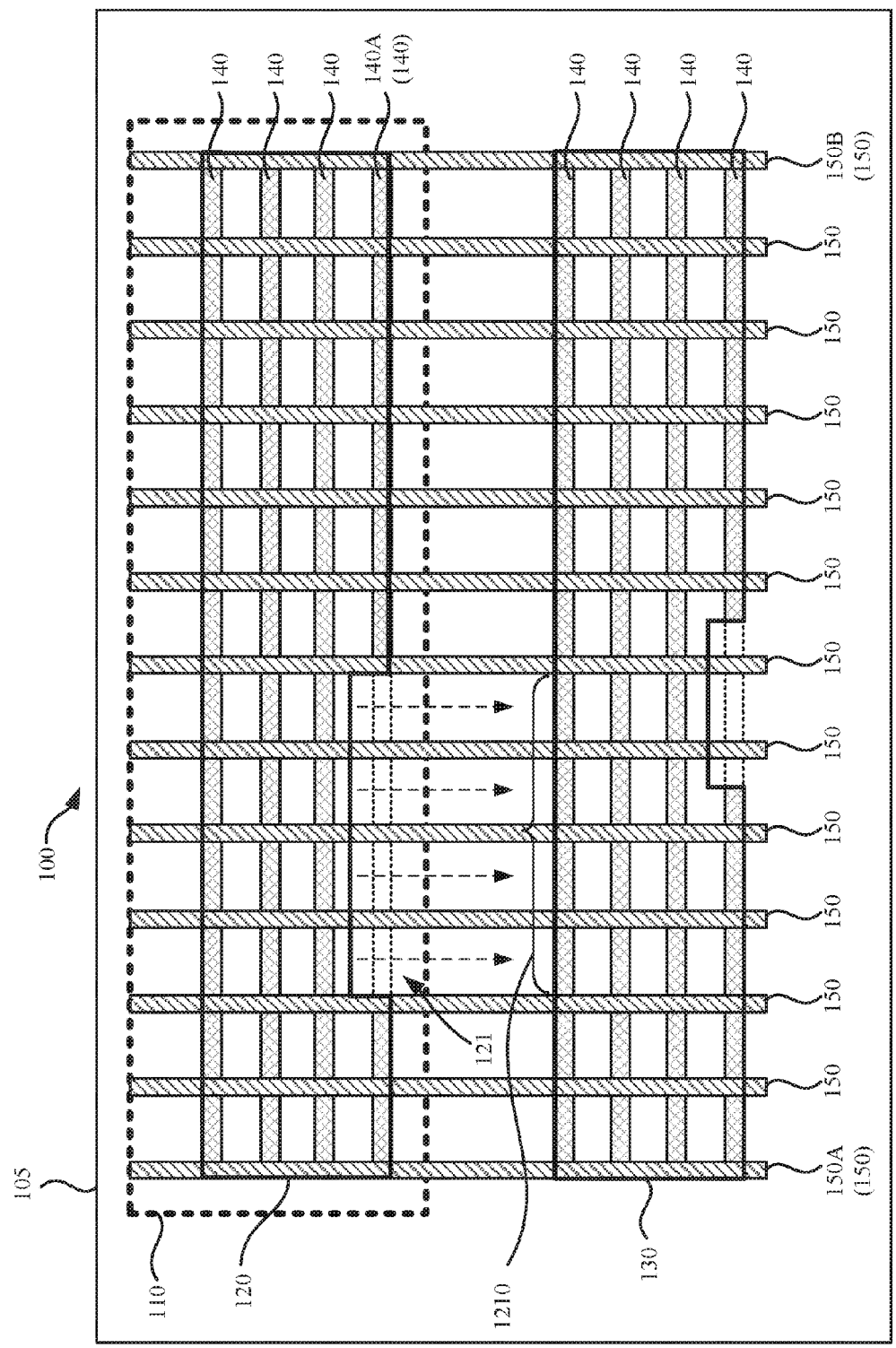
FIG. 1 is a top-view of a schematic layout of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, relative terms, such as "lower," "beneath," or "bottom" and "upper," "over," or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a top-view of a schematic layout of a semiconductor device 100, in accordance with some embodiments of the present disclosure. In some embodiments, the semiconductor device 100 is applied in fin field-effect transistors (FINFETs).

For illustration, the semiconductor device 100 includes a substrate 105, and a well 110. In some embodiments, the well 110 is arranged on the substrate 105. In some embodiments, the well 110 is an N-type well, and the substrate 105 is a P-type semiconductor substrate. In some embodiments, transistors (not shown), which are formed in the well 110, are P-type. In some embodiments, transistors (not shown) that are formed outside the well 110 are N-type.

The above types of the substrate 105 and the types of the well 110 are given for illustrative purposes. Various types of the substrate 105 and various types of the well 110 are within the contemplated scope of the present disclosure.

As illustratively shown in FIG. 1, the semiconductor device 100 also includes fins 140. In some embodiments, the fins 140 are arranged in parallel with each other and equally spaced apart. In some embodiments, the fins 140 are formed on an area 120 and an area 130 of the substrate 105. In some embodiments, the fins 140 are arranged to operate as source/drain terminals of the FINFETs.

In some embodiments, the fins 140 are implemented with a semiconductor material. In further embodiments, the semiconductor material includes one or more of a group IV element or compound, an III-V compound, or an II-VI compound. The implementations of the fins 140 are given for illustrative purposes only. Various implementations of the fins 140 are within the contemplated scope of the present disclosure. The number of the fins 140 is given for illustrative purpose only, and any number of fins 140 is within the contemplated scope of the present disclosure.

As illustratively shown in FIG. 1, the semiconductor device 100 also includes gates 150 intersecting the fins 140. The gates 150 are disposed over the area 120 and the area 130. In some embodiments, the gates 150 are arranged in parallel with each other and equally spaced apart. In some embodiments, the gates 150 are arranged to operate as gate terminals of the FINFETs.

For illustration in FIG. 1, in a top-down sequence, the gates 150 are formed to intersect the fins 140. In some embodiments, the fins 140 are formed with a thin-vertical structure and arranged on the area 120 and the area 130 of the substrate 105. In some embodiments, the gates 150 are formed to wrap around the thin-vertical structure of the fins 140.

In some embodiments, the gates 150 are implemented with polysilicon. Accordingly, the term "gate" discussed in the present disclosure is also referred to as "PO" in some embodiments. Various conductive materials used to form the gates 150 are within the contemplated scope of the present disclosure. For example, in various embodiments, the gates 150 are implemented of metals, metal alloys, metal silicides, or the like.

For illustration in FIG. 1, a leftmost gate 150 of the gates 150 is also labeled as the gate 150A, and a rightmost gate 150 of the gates 150 is also labeled as the gate 150B. In some embodiments, the gates 150A and 150B are disposed over and cover opposite edges of the area 120 and opposite edges of the area 130. Accordingly, the gates 150A and 150B are also referred to as "PODE (poly on OD edge)" structures in some embodiments. In some embodiments, the PODE structures are arranged to cover and protect ends of the fins 140, in order to provide additional reliability to the fins 140 during the manufacturing process. In some embodiments, the term "PODE structure" in the present disclosure is implemented with dummy gates, which does not act a gate to any transistor.

In some embodiments, the area 120 of the substrate 105 includes a recess 121. The recess 121 is disposed at a side of the area 120, and faces the area 130. A corresponding fin 140A of the fins 140 that is arranged across the recess 121 is separated into multiple portions, in which a dashed-line portion, as illustrated in FIG. 1, of the fin 140A is cut off. Effectively, the fin 140A is divided, through the recess 121, into two independent fins 140 that are located at sides of the recess 121 respectively. In some embodiments, a side area 1210 facing the recess 121, on the side of the area 130 is configured to be substantially flat. In other words, in some embodiments, at least one portion of an edge of the area 130 facing the recess 121 of the area 120 is configured to be substantially flat. For illustration of FIG. 1, the side area 1210 facing the recess 121 falls on a substantially flat surface of the area 130. With such arrangement, the fins 140 are able to be prevented from damaging during the manufacturing process. The detailed explanations are given with FIG. 2 below.

The following paragraphs describe certain embodiments related to the semiconductor device 100 to illustrate arrangements of the layout patterns thereof. However, the present disclosure is not limited to the following embodiments. Various arrangements are able to implement the semiconductor device 100 in FIG. 1 are within the contemplated scope of the present disclosure.

In some embodiments, the top-view of the schematic layout of the semiconductor devices 100 illustrated in FIG. 1 is able to be applied in a layout design for the FINFETs. For example, FIG. 1 is able to be utilized as a layout diagram of the FINFET, such that one or more semiconductor manufacturing equipments are able to perform semiconductor fabrication on wafer according to the layout diagram.

Figure 2:
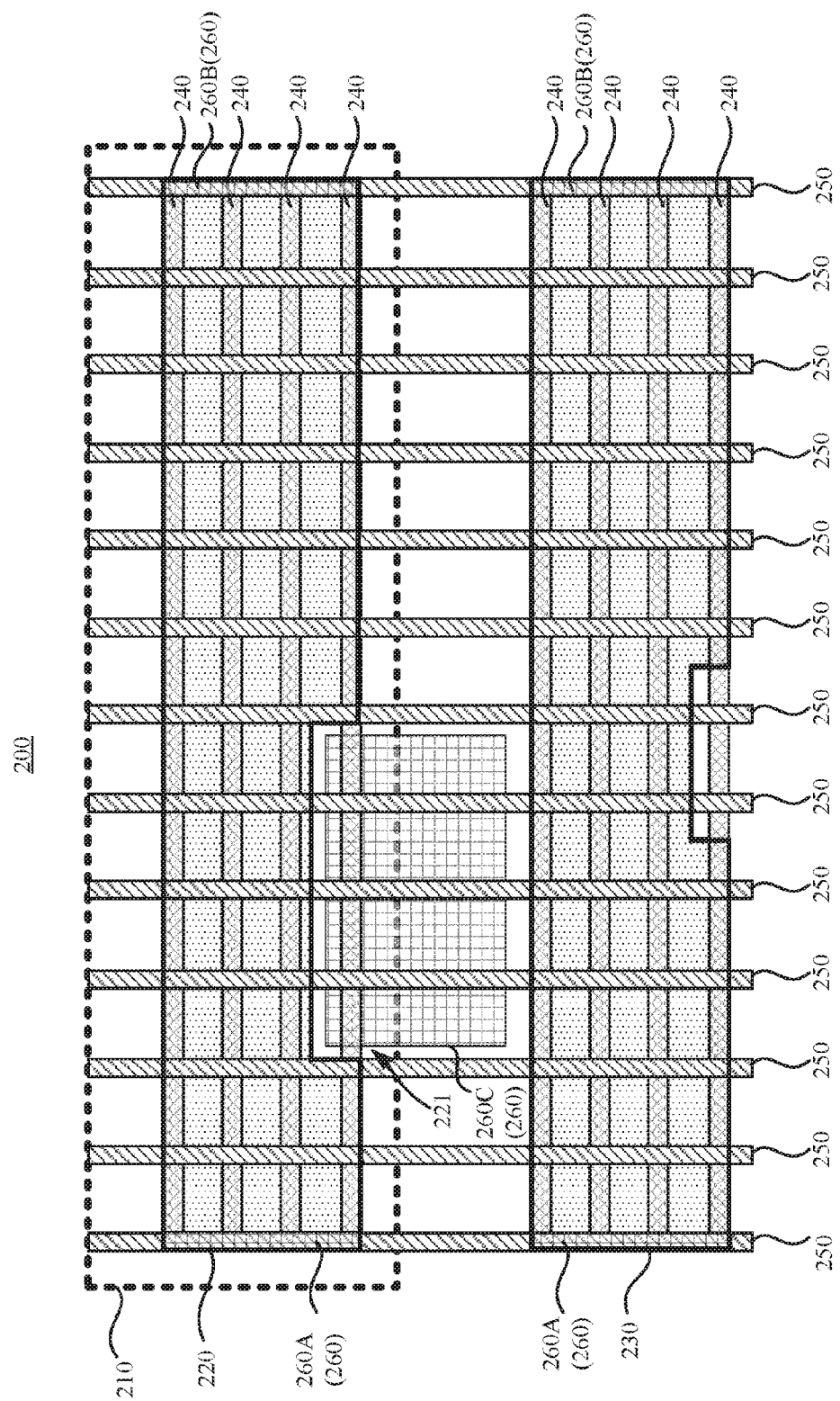
FIG. 2 is a schematic diagram illustrating a layout design corresponding to the semiconductor device in FIG. 1, in accordance with some embodiments of the present disclosure.
Figure 3:
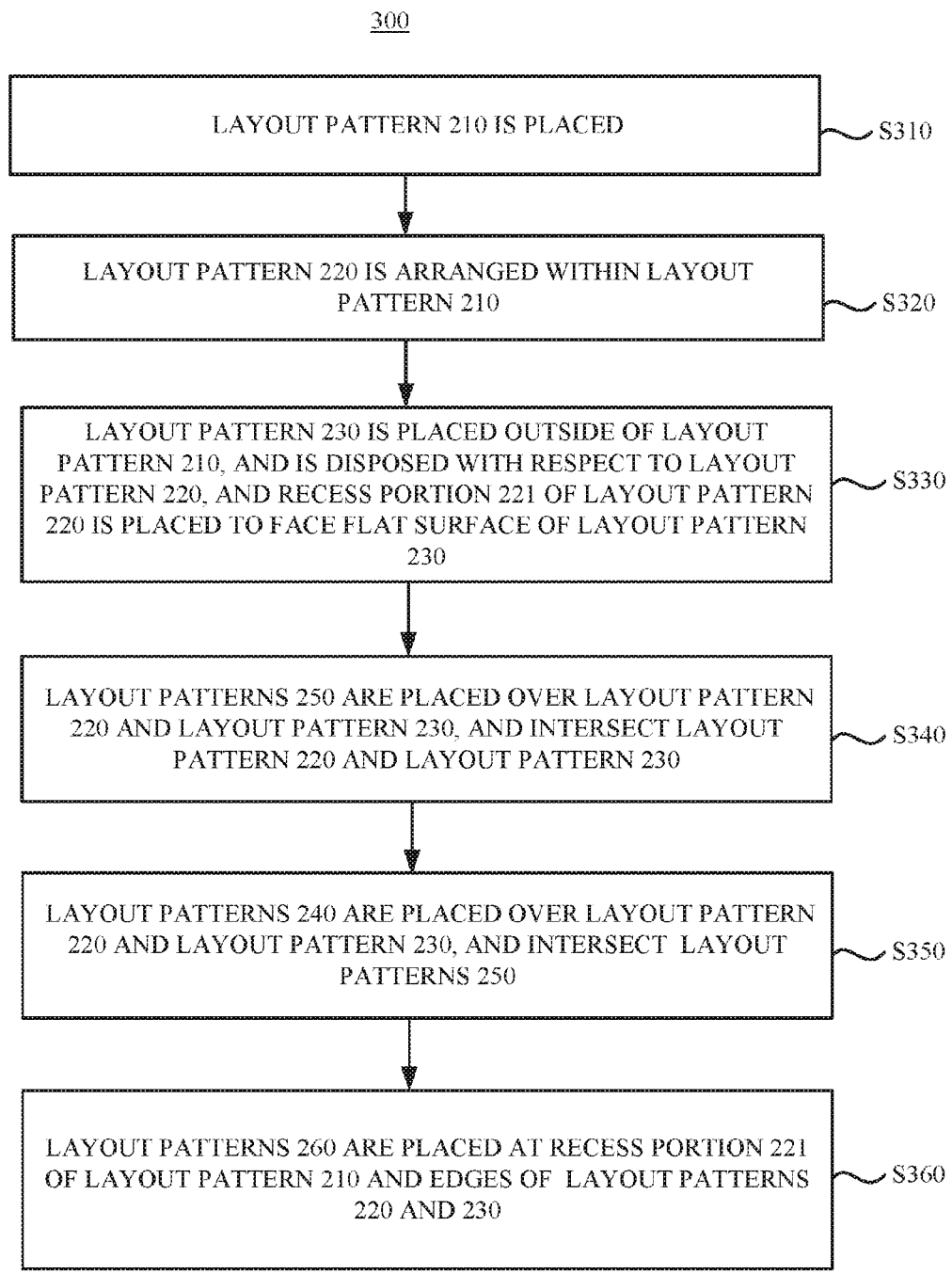
FIG. 3 is a flow chart of a method for arranging the layout design in FIG. 2, in accordance with some embodiments of the present disclosure.

Reference is now made to both of FIG. 2 and FIG. 3. FIG. 2 is a schematic diagram illustrating a layout design 200 corresponding to the semiconductor device 100 in FIG. 1, in accordance with some embodiments of the present disclosure. FIG. 3 is a flow chart of a method 300 for arranging the layout design 200 in FIG. 2, in accordance with some embodiments of the present disclosure. As illustrative shown in FIG. 2, the layout design 200 includes layout patterns 210, 220, 230, 240, 250, and 260.

For simplicity, the following descriptions are given with an example in which the semiconductor device 100 in FIG. 1 is implemented according to the layout design 200 and the method 300. In some embodiments, the method 300 includes operations S310, S320, S330, S340, S350, and S360.

In operation S310, a layout pattern 210 is placed. In operation S320, a layout pattern 220 is arranged within the layout pattern 210. For illustration, the layout pattern 210 corresponds to the well 110 in FIG. 1. The layout pattern 220 corresponds to the area 120 in FIG. 1.

In operation S330, a layout pattern 230 is placed outside of the layout pattern 210, and is disposed with respect to the layout pattern 220, and a recess portion 221 of the layout pattern 220 is placed to face a flat surface of the layout pattern 230. For illustration, the layout pattern 230 corresponds to the area 130 of the substrate 105 in FIG. 1. In some embodiments, the layout patterns 220 and 230 are utilized to allow a layout designer and/or a design system to identify at which area that the fins 140 in FIG. 1 are located in the layout design 200. As illustrated in FIG. 1, the area 130 of the substrate 105 is arranged with respect to the area 120. Accordingly, the layout pattern 230 is placed with respect to the layout pattern 220. Moreover, the recess portion 221 corresponds to the recess 121 of the area 120 in FIG. 1. With such the arrangement, the side area facing the recess 121, on the side of the area 130, is able to be located within the flat surface of the area 130.

In operation S340, layout patterns 250 are placed over the layout pattern 220 and the layout pattern 230, and intersect the layout pattern 220 and the layout pattern 230. For illustration, the layout patterns 250 correspond to the gate 150 in FIG. 1. The layout patterns 250 are placed in parallel with each other to define the locations of the gates 150 in FIG. 1 during the formation of the device 100.

In operations S350, layout patterns 240 are placed over the layout pattern 220 and the layout pattern 230, and intersect the layout patterns 250. For illustration, the layout patterns 240 correspond to the fins 140 in FIG. 1. The layout patterns 240 are placed in parallel with each other and intersecting the layout patterns 250, to define the location of the fins 140 in FIG. 1 during the formation of the device 100. In some embodiments, the layout patterns 240 are utilized to allow a layout designer and/or a design system to identify where the fins 140 in FIG. 1 are formed in the device 100.

In operation S360, layout patterns 260 are placed at the recess portion 221 of the layout pattern 210 and the edges of the layout patterns 220 and 230. For illustration, in some embodiments, the layout patterns 260 correspond to PODE structures. A layout pattern 260A of the layout patterns 260 is disposed at an edge of the layout pattern 220 and an edge of the layout pattern 230, in order to define the location of the gate 150A in FIG. 1. A layout pattern 260B of the layout patterns 260 is disposed at another edge of the layout pattern 220 and another edge of the layout pattern 230, which is opposite to the layout pattern 260A, to define the location of the gate 150B in FIG. 1.

Moreover, a layout pattern 260C of the layout patterns 260 is placed in the recess portion 221. Accordingly, a corresponding PODE structure (not shown) is arranged in the recess 121 as illustrated in FIG. 1 to support and/or protect the dashed-line portion of fin 140A and/or the gates 150 as illustrated in FIG. 1, which are arranged across the recess 121, during the formation of the semiconductor device 100 in FIG. 1. In some embodiments, the PODE structure (not shown), which corresponds to the layout pattern 260C, is removed in the end of the formation of the semiconductor device 100.

In some approaches, an L-shaped PODE structure is formed in a recess of the area to support the fins. During the removing process of the L-shaped PODE structures, a mismatch could present at the L-shaped PODE structure. As a result, the fins arranged adjacent to L-shaped PODE structure are damaged. Accordingly, the yield of manufacturing the FINFETs is reduced.

Compared with the approaches above, as illustrated above in FIG. 1, the side area 1210 facing the recess 121, on the side of the area 130, is configured to be substantially flat. Accordingly, in some embodiments, the side of the layout pattern 260 facing the layout pattern 220 in FIG. 2 is configured to be substantially flat. With such the arrangement, during the manufacturing process, the PODE structures are able to be formed in a shape excluding the L-shape. For illustration in FIG. 2, the layout pattern 260 is configured to have a rectangle shape. Accordingly, compared to the approaches above, the fin 140A, which is arranged across the recess 121, is able to be prevented from damaging during the manufacturing process. As a result, the yield of manufacturing the semiconductor device 100 in FIG. 1 is improved.

After operation S360 is performed, the layout design 200 in FIG. 2 is determined. As described above, in some embodiments, a wafer including the device 100 in FIG. 1 is able to be fabricated through one or more semiconductor manufacturing equipments according to the layout design 200.

In some embodiments, the method 300 is implemented in a design tool carried in an electronic design automation (EDA) system. As such, the layout design 200 is able to be generated from the design tool with an auto place and route (APR) tool carried in the EDA system. In some other embodiments, the layout design 200 is manually designed by a layout designer through the design tool.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

Figure 4A:
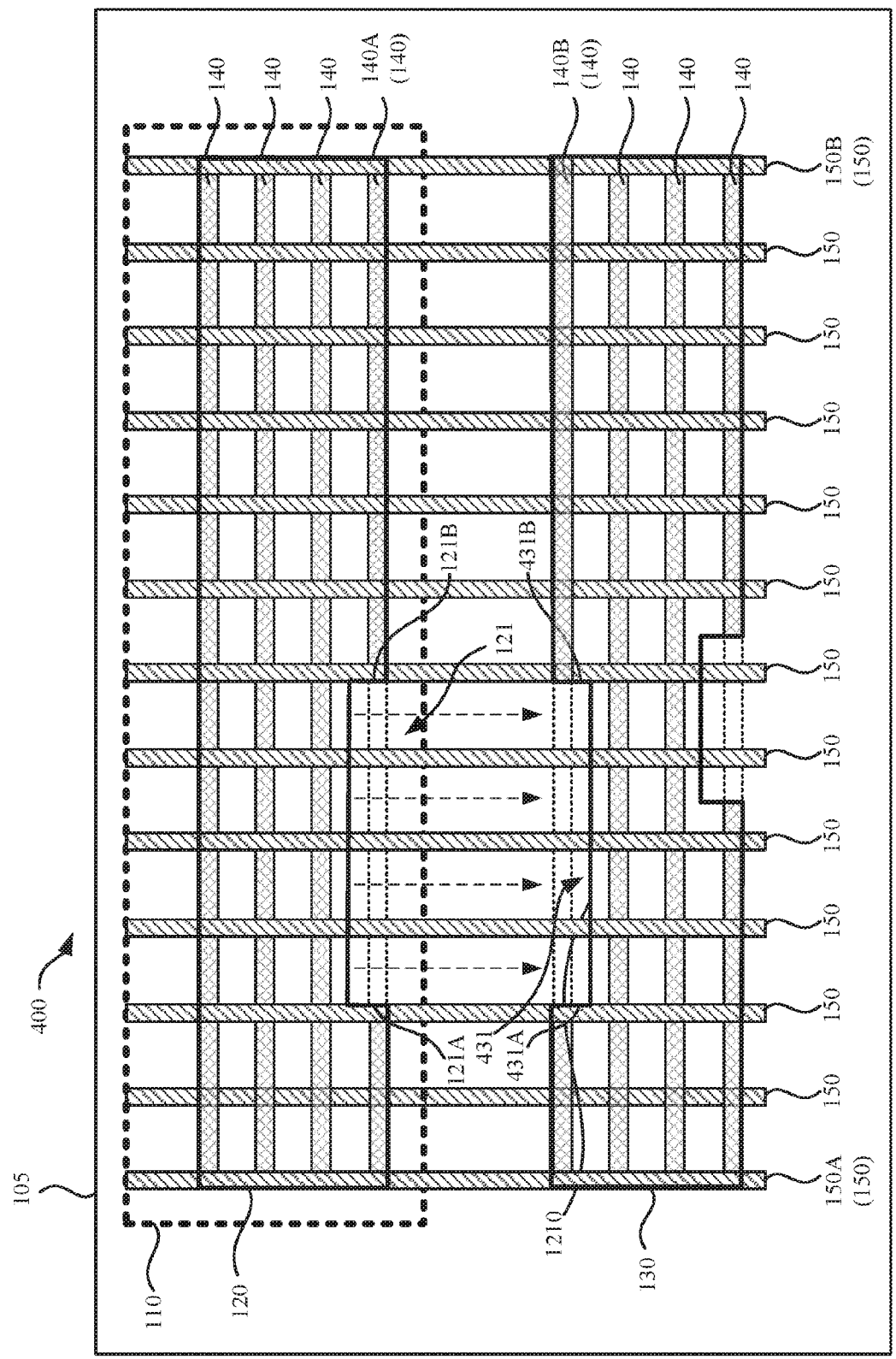
FIG. 4A is a top-view of a schematic layout of a semiconductor device, in accordance with some embodiments of the present disclosure.

Reference is now made to FIG. 4A. FIG. 4A is a top-view of a schematic layout of a semiconductor device 400, in accordance with some embodiments of the present disclosure. With respect to the embodiments of FIG. 1, like elements in FIG. 4A are designated with the same reference numbers for ease of understanding.

In some embodiments of FIG. 4A, compared with the semiconductor device 100 in FIG. 1, the area 130 in FIG. 4A further includes a recess 431. The recess 431 is disposed at a side of the area 130 and faces the recess 121 of the area 120. A corresponding fin 140B of the fins 140 that is arranged across the recess 431 is separated into multiple portions, in which a dashed-line portion, as illustrated in FIG. 4A, of the fin 140B is removed. In some embodiments, the side area 1210 facing the recess 121, on the side of the area 130, is substantially flat. For illustration, the recess 121 includes an edge 121A and an edge 121B. The recess 431 includes an edge 431A and an edge 431B. The edge 121A of the recess 121 is substantially aligned with the edge 431A of the recess 431, and the edge 121B of the recess 121 is substantially aligned with the edge 431B of the recess 431. In some embodiments, an edge, which is located between the edges 431A and 431B of the recess 431, of area 130 is configured to face the area 120 and correspond to the recess 121 is substantially flat. With such arrangement, the side area 1210 facing the recess 121 falls on a substantially flat surface between the edges 431A and 431B of the recess 431. Accordingly, during the manufacturing process, the PODE structure (not shown), which is, for example, configured to be formed between the recess 121 and the recess 431 according to the layout pattern 260C in FIG. 2, is able to have the rectangle shape. As described above, compared to the approaches employing L-shaped PODE structures, the yield of manufacturing of the semiconductor device 400 is thus improved.

Figure 4B:
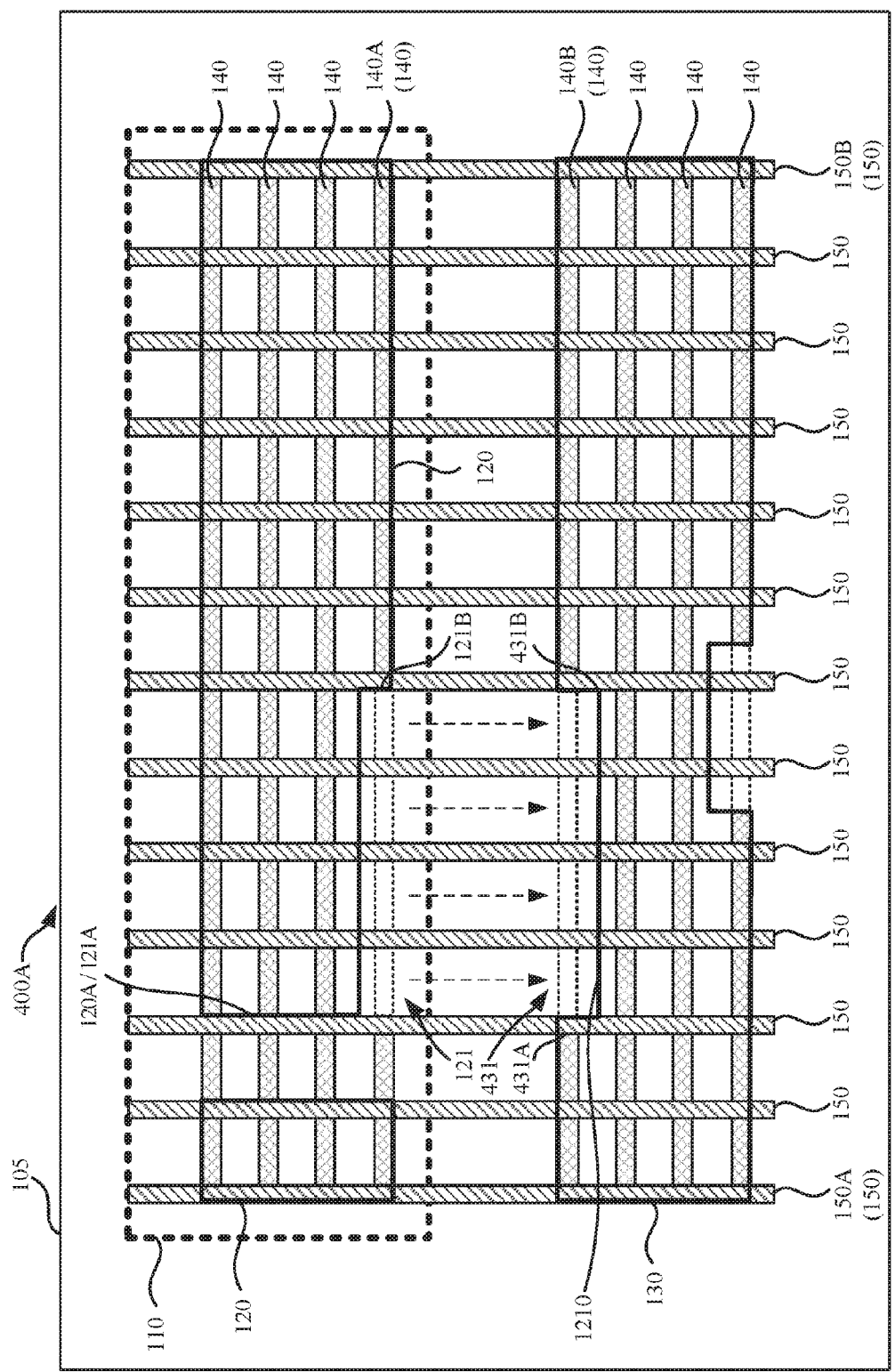
FIG. 4B is a top-view of a schematic layout of a semiconductor device, in accordance with some alternative embodiments of the present disclosure.

Reference is now made to FIG. 4B. FIG. 4B is a top-view of a schematic layout of a semiconductor device 400A, in accordance with some alternative embodiments of the present disclosure. With respect to the embodiments of FIG. 4A, like elements in FIG. 4B are designated with the same reference numbers for ease of understanding.

In some embodiments of FIG. 4B, compared with the semiconductor device 400 in FIG. 4A, the edge 121A of the recess 121 is an edge 120A of the area 120. In other words, in the embodiments of FIG. 4B, the recess 121 is arranged at a side of a portion of the area 120. As discussed above, the edge 121A is substantially aligned with the edge 431A, and the edge 121B is substantially aligned with the edge 431B. Accordingly, during the manufacturing process, the PODE structure (not shown), which is, for example, configured to be formed between the recess 121 and the recess 431 according to the layout pattern 260C in FIG. 2, have the rectangle shape. With such arrangement, the side area 1210 facing the recess 121 falls on a substantially flat surface between the edges 431A and 431B of the recess 431. As a result, compared with the approaches employing L-shaped PODE structures, the yield of manufacturing of the semiconductor device 400A is improved.

Figure 4C:
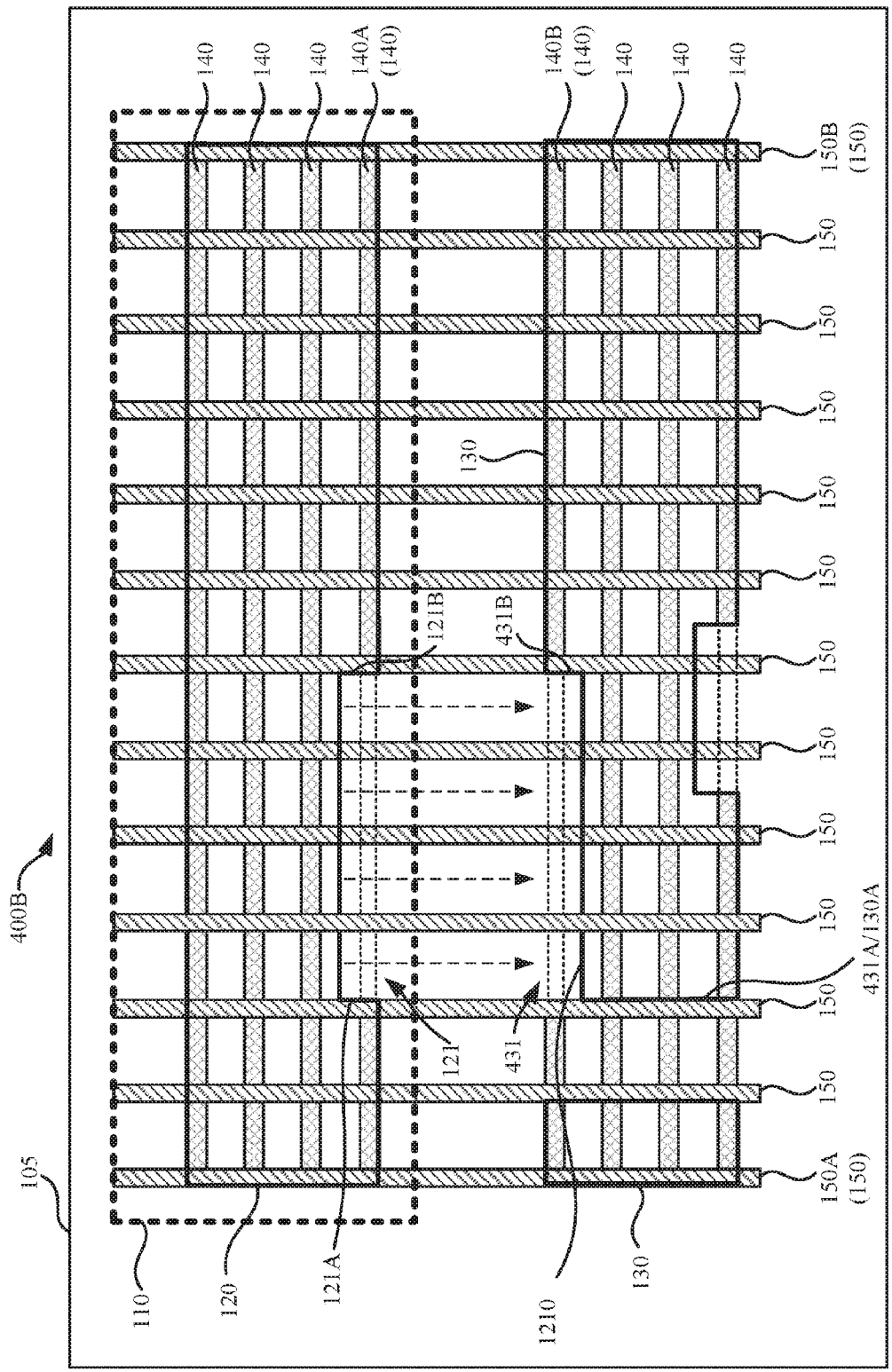
FIG. 4C is a top-view of a schematic layout of a semiconductor device, in accordance with some alternative embodiments of the present disclosure.

Reference is now made to FIG. 4C. FIG. 4C is a top-view of a schematic layout of a semiconductor device 400B, in accordance with some alternative embodiments of the present disclosure. With respect to the embodiments of FIG. 4B, like elements in FIG. 4C are designated with the same reference numbers for ease of understanding.

Figure 5:
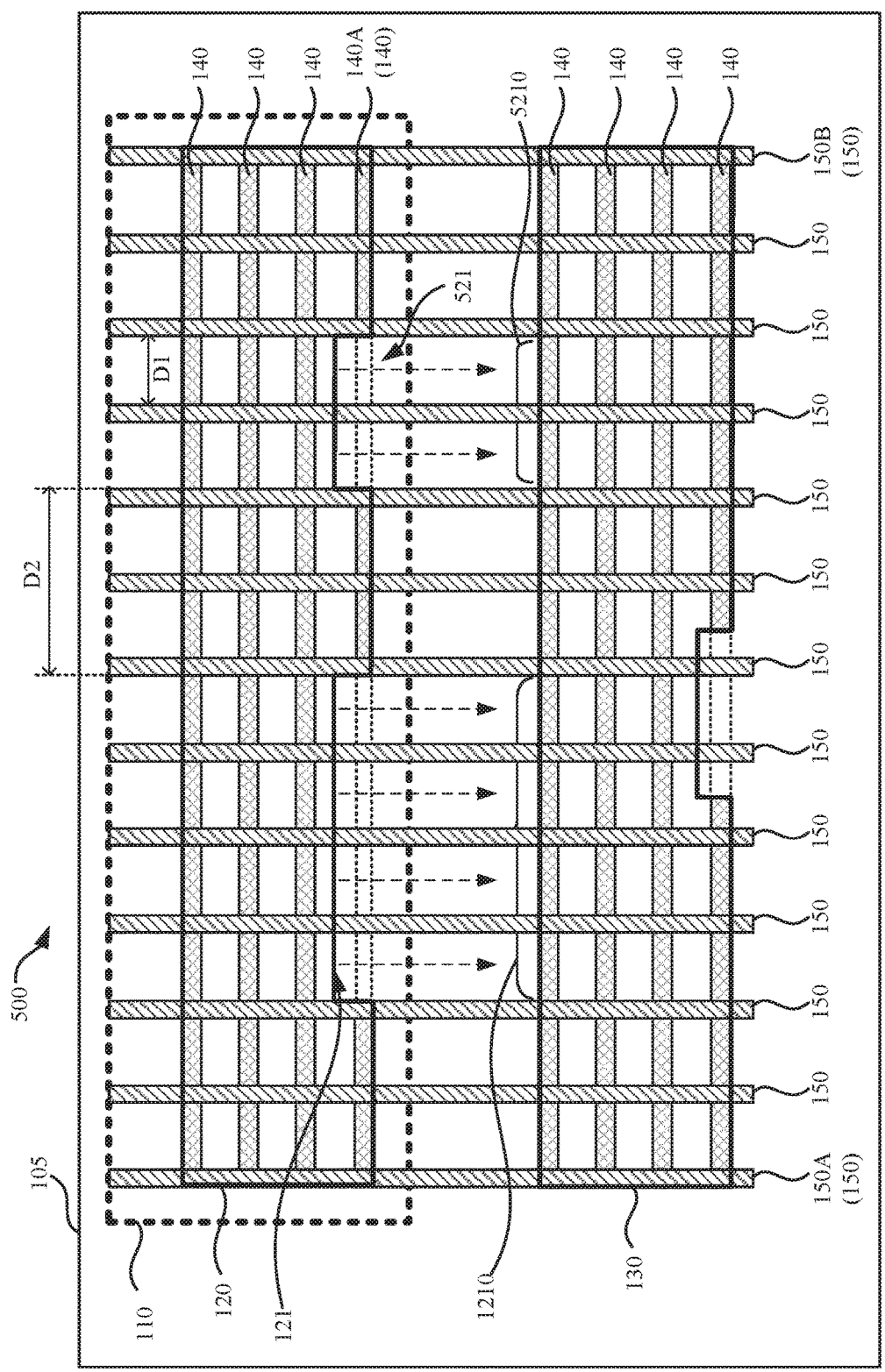
FIG. 5 is a top-view of a schematic layout of a semiconductor device, in accordance with some embodiments of the present disclosure.

In some embodiments of FIG. 4C, compared with the semiconductor device 400 in FIG. 4A, the edge 431A of the recess 431 is an edge 130A of the area 130. In other words, in the embodiments of FIG. 4C, the recess 431 is arranged at a side of a portion of the area 130. As discussed above, the edge 431A is substantially aligned with the edge 121A, and the edge 431B is substantially aligned with the edge 121B. Accordingly, during the manufacturing process, the PODE structure (not shown), which is, for example, configured to be formed between the recess 121 and the recess 431 according to the layout pattern 260C in FIG. 2, have the rectangle shape. With such arrangement, the side area 1210 facing the recess 121 falls on a substantially flat surface between the edges 431A and 431B of the recess 431. As a result, compared to the approaches employing L-shaped PODE structures, the yield of manufacturing of the semiconductor device 400B is improved Reference is now made to FIG. 5. FIG. 5 is a top-view of a schematic layout of a semiconductor device 500, in accordance with some embodiments of the present disclosure. With respect to the embodiments of FIG. 4A, like elements in FIG. 5 are designated with the same reference numbers for ease of understanding.

In some embodiments of FIG. 5, compared with the semiconductor device 100 in FIG. 1, the area 120 in FIG. 5 further includes a recess 521. The recess 521 is disposed at a side of the area 120, and faces the recess 121. In some embodiments, the fin 140A that is arranged across the recess 121 and the recess 521 is separated into multiple portions, in which dashed-line portions, as illustrated in FIG. 5, of the fin 140A are cut off. Effectively, the fin 140A is further divided, by the recess 521, into independent fins 140 that are located at sides of the recess 521 respectively. Corresponding to the recess 121, a side area 5210 facing the recess 521, on the side of the area 130, is configured to be substantially flat, in order to increase yield of manufacturing of the semiconductor device 500.

Furthermore, in some embodiments, a predetermined distance D1 is present between two adjacent gates 150. In some embodiments, the predetermined distance D1 is defined or limited by a technology file from a semiconductor foundry. As illustratively shown in FIG. 5, a distance D2 is present between the recess 121 and the recess 521. In some embodiments, the distance D2 is configured to be equal to or greater than about twice of the distance D1. With such the arrangement, during the manufacturing process, the PODE structures (not shown), which are, for example, formed between the area 120 and the area 130 according to the layout pattern 260C in FIG. 2, are able to be prevented from being formed with an L-shape. Accordingly, as described above, the yield of manufacturing of the semiconductor device 500 is thus improved.

Figure 6:
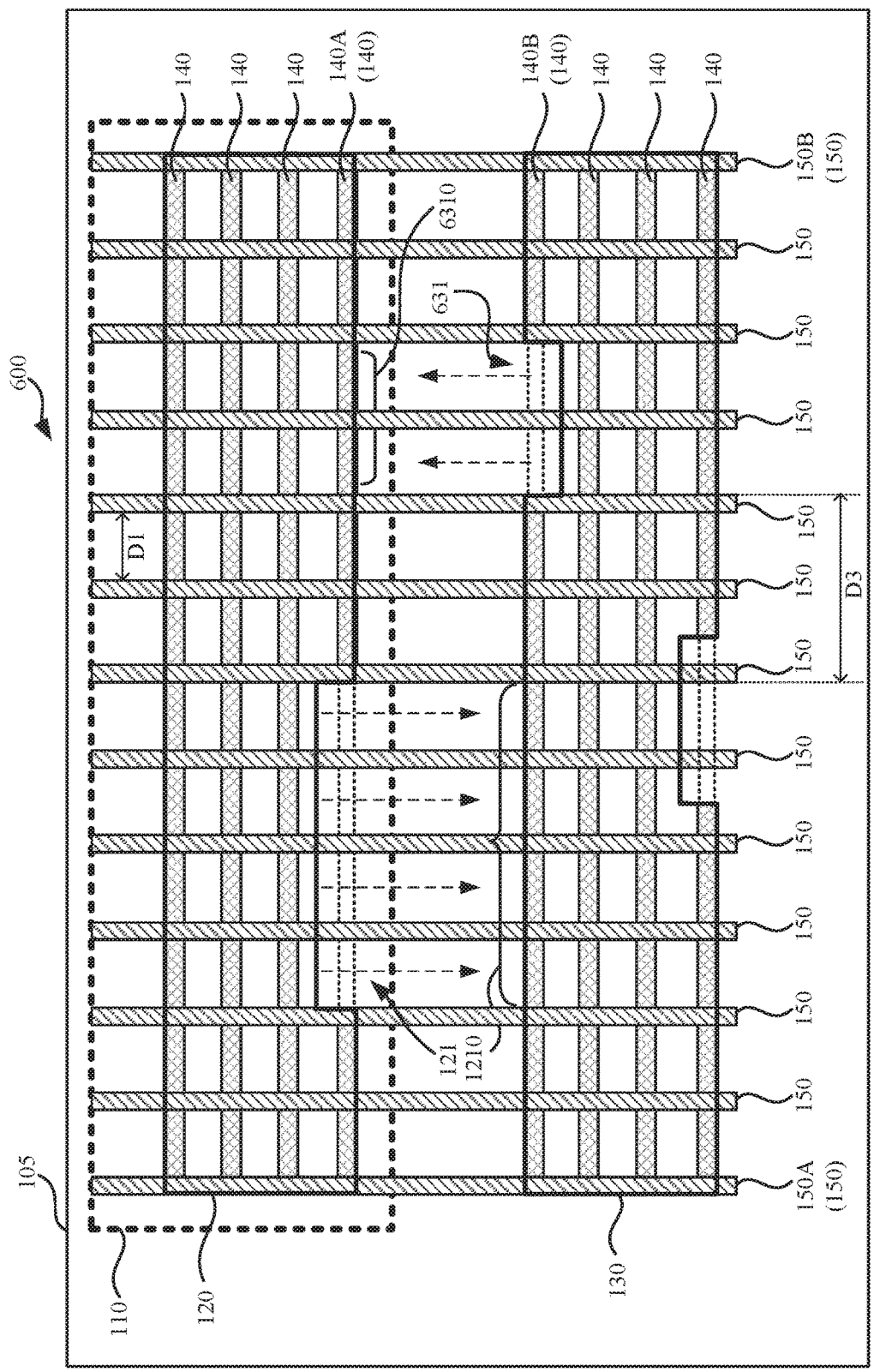
FIG. 6 is a top-view of a schematic layout of a semiconductor device, in accordance with some embodiments of the present disclosure.

Reference is now made to FIG. 6. FIG. 6 is a top-view of a schematic layout of a semiconductor device 600, in accordance with some embodiments of the present disclosure. With respect to the embodiments of FIG. 5, like elements in FIG. 6 are designated with the same reference numbers for ease of understanding.

In some embodiments of FIG. 6, compared with the semiconductor device 100 in FIG. 1, the area 130 further includes a recess 631. The recess 631 is disposed at the side of the area 130, and faces the recess 121. The corresponding fin 140B that is arranged across the recess 631 is separated into multiple portions, in which a dashed-line portion, as illustrated in FIG. 6, of the fin 140B is removed. In some embodiments, a side area 6310 facing the recess 631, on the side of the area 120 is configured to be substantially flat. Accordingly, compared to the approaches employing L-shaped PODE structures, the yield of manufacturing of the semiconductor device boo is improved.

Furthermore, as described above, the predetermined distance D1 is present between two adjacent gates 150. As illustratively shown in FIG. 6, a distance D3 is present between the recess 121 and the recess 631. In some embodiments, the distance D3 is configured to be equal to or greater than about twice of the distance D1. With such arrangement, during the manufacturing process, the PODE structures (not shown), which are formed between the area 120 and the area 130 according to the layout pattern 260C in FIG. 2, are able to be prevented from being formed with an L-shape. Accordingly, as described above, the yield of manufacturing of the semiconductor device 600 is thus improved.

The arrangements of the distance between two recesses are given for illustrative purposes. Various arrangements of the distance between two recesses, which are able to prevent from forming an L-shaped PODE structure during the manufacturing process, are within the contemplated scope of the present disclosure.

Figure 7:
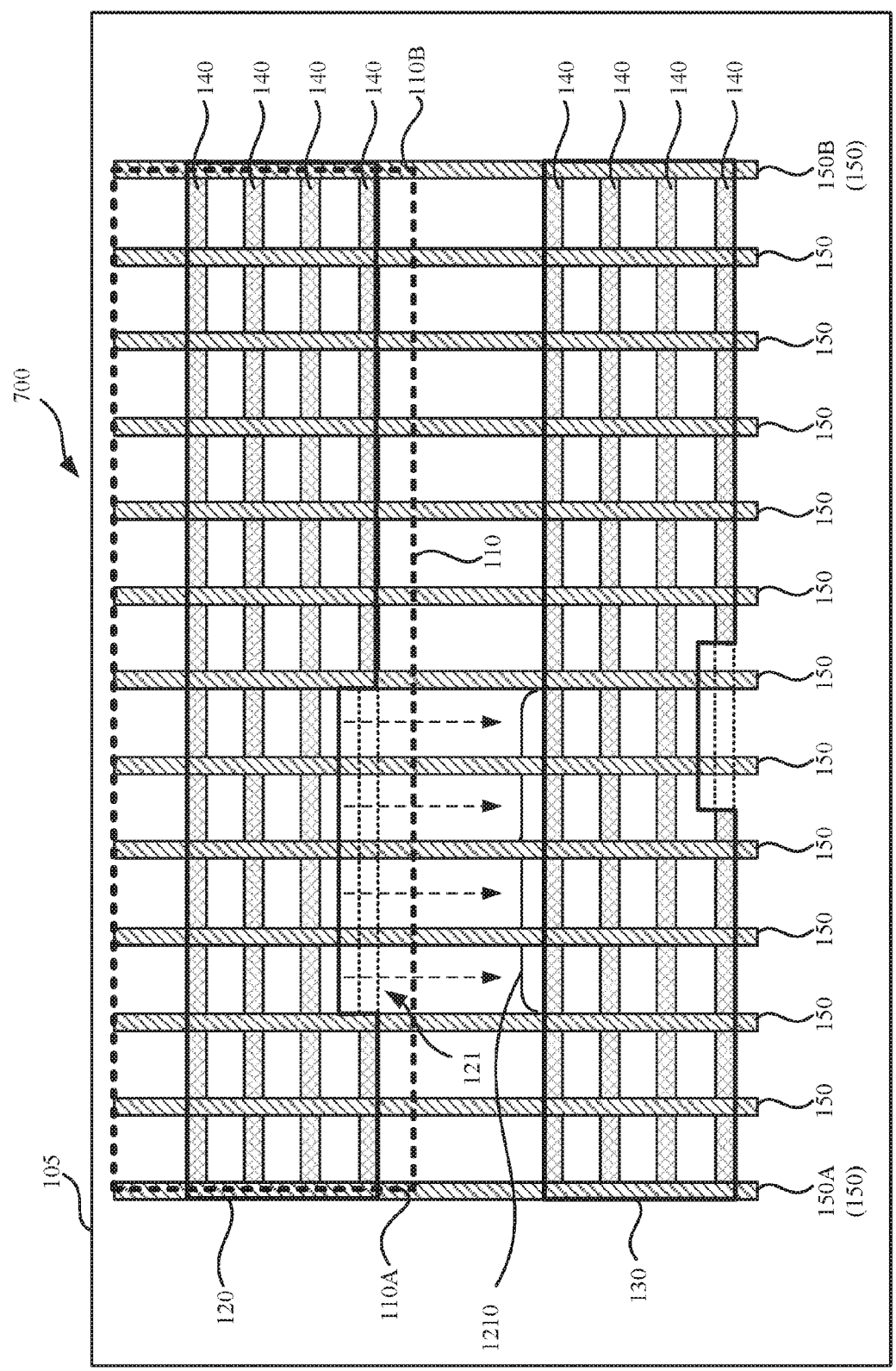
FIG. 7 is a top-view of a schematic layout of a semiconductor device, in accordance with some embodiments of the present disclosure.

Reference is now made to FIG. 7. FIG. 7 is a top-view of a schematic layout of a semiconductor device 700, in accordance with some embodiments of the present disclosure. With respect to the embodiments of FIG. 1, like elements in FIG. 7 are designated with the same reference numbers for ease of understanding.

In some embodiments of FIG. 7, an edge 110A of the well 110 is substantially aligned with a central of the gate 150A, and an edge 110B of the well 110 is substantially aligned with a central of the gate 150B. With such arrangement, compared with the semiconductor device 100 in FIG. 1, the area of the well 110 is reduced, and thus the area of the semiconductor device 700 is able to be reduced. In some other embodiments, one of the edges 110A and 110B of the well 110 is substantially aligned with a central of a corresponding one of the gates 150A and 150B. For illustration, in a view of chip level, the edge 110B of the well 110 is substantially aligned with the central of the gate 150B, and the edge 110A of the well 110 is located at boundary cells, corner cells, and/or row cells (not shown in FIG. 7). In some embodiments, the boundary cells, the corner cells, and the row cells are arranged such that the well 110 surrounds the area 120. The arrangements of the edges 110A and 110B of the well 100 are given for illustrative purposes only. Various arrangements of the edges 110A and 110B of the well 100 are within the contemplated scope of the present disclosure.

As described above, the top-view of the schematic layout of semiconductor devices in the embodiments above are able to be applied in the layout design of the FINFET. In further embodiments, the top-views of the schematic layout of the semiconductor devices given above are able to be applied in design of a cell library for forming one or more the semiconductor devices above. For example, in some embodiments, a number of the semiconductor devices 100 in FIG. 1 are able to formed and aligned with each other in a vertical direction.

Figure 8:
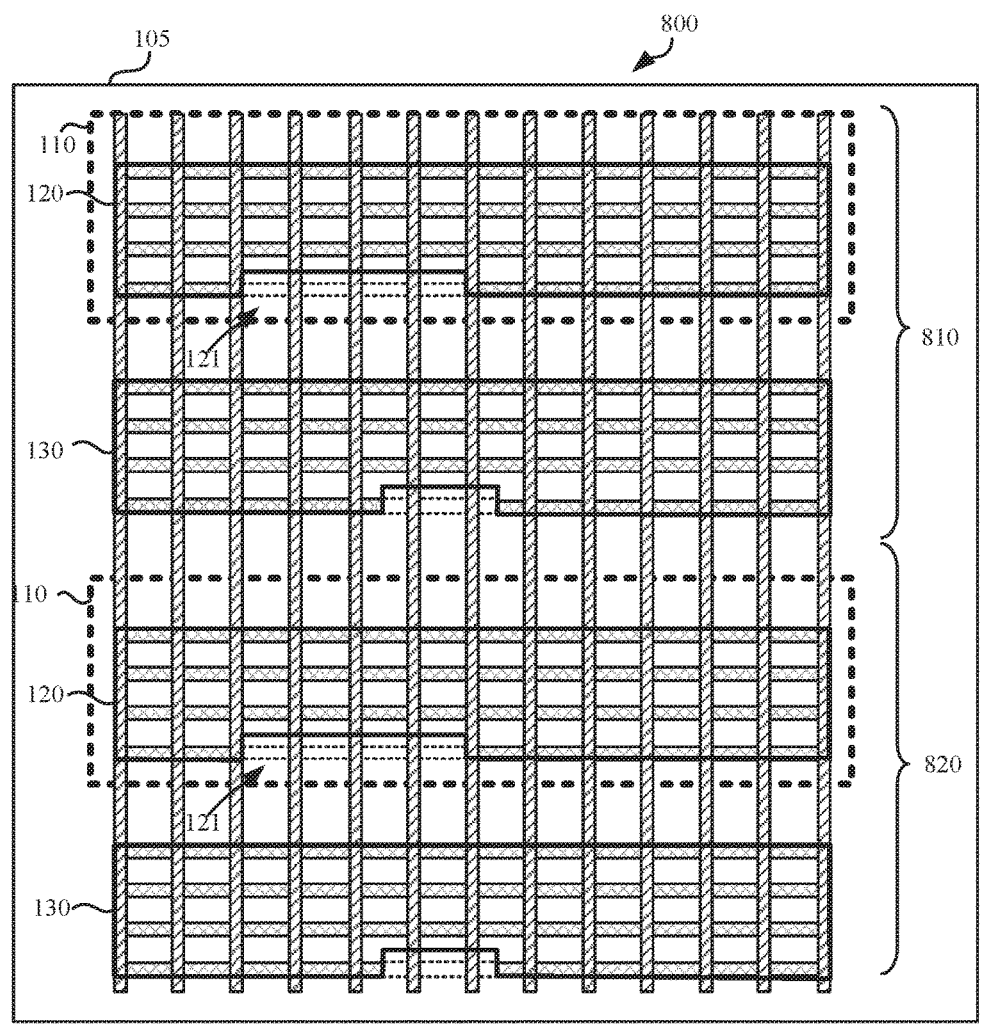
FIG. 8 is a top-view of a schematic layout of a semiconductor device, in accordance with some embodiments of the present disclosure.

Reference is now made to FIG. 8. FIG. 8 is a top-view of a schematic layout of a semiconductor device 800, in accordance with some embodiments of the present disclosure. With respect to the embodiments of FIG. 1, like elements in FIG. 8 are designated with the same reference numbers for ease of understanding.

In some embodiments, the semiconductor device 800 is formed through one or more semiconductor manufacturing equipments according to the layout design 200 in FIG. 2. As illustratively shown in FIG. 8, the semiconductor device 800 includes a portion 810 and a portion 820. The portion 810 is disposed adjacent to the portion 820. For example, the layout patterns corresponding to the portion 810 and the portion 820 are able to be placed through the auto place and route (APR) tool according to a cell library storing the layout design 200 in FIG. 2. The arrangements of each of the portion 810 and the portion 820 are the same as those of the semiconductor device 100 in FIG. 1. Thus, the repetitious descriptions are not further given herein. Effectively, as illustrated in FIG. 8, a number of the semiconductor devices 100 in FIG. 1 are arranged sequentially in a longitudinal direction.

Figure 9A:
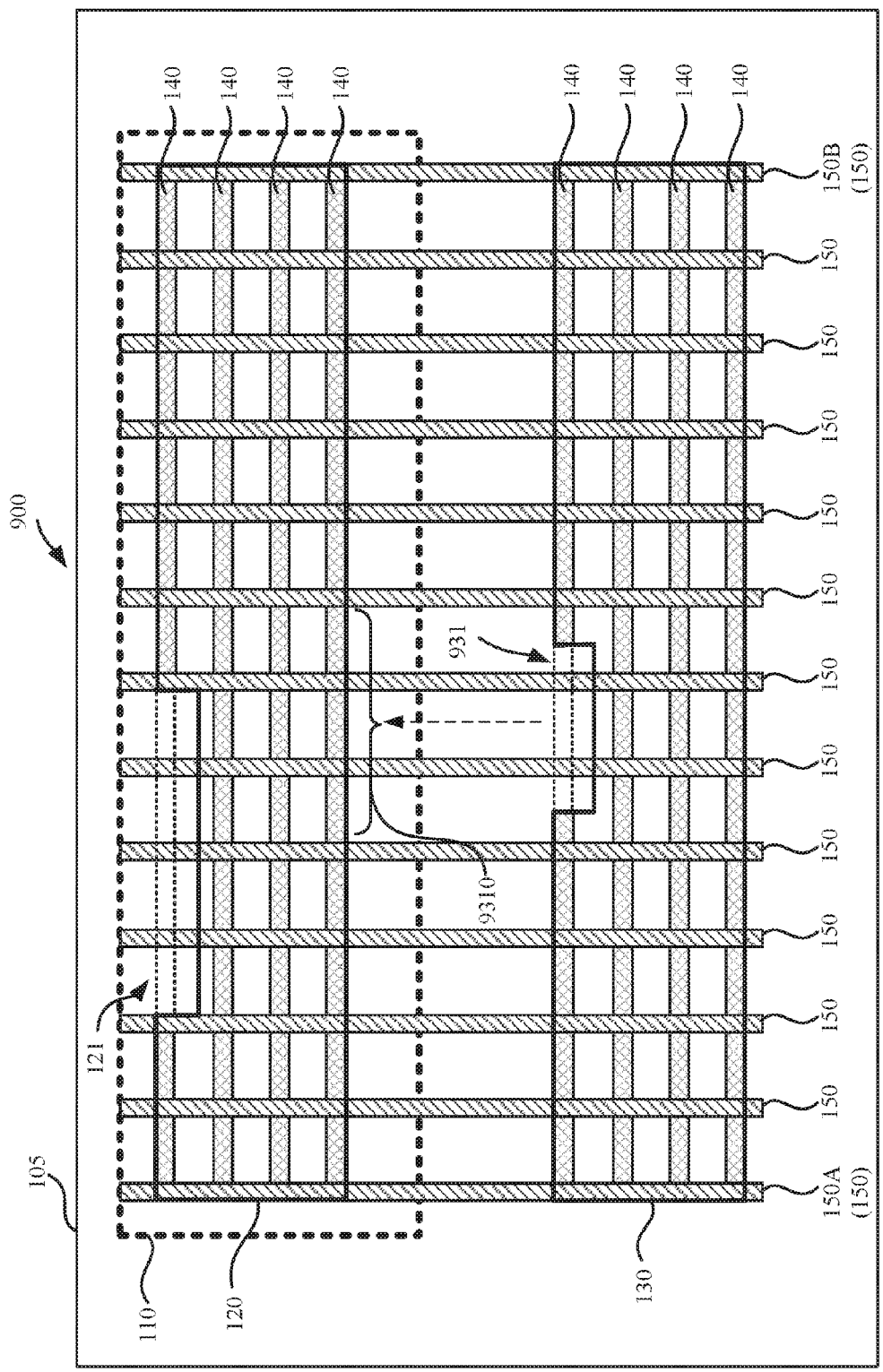
FIG. 9A is a top-view of a schematic layout of a semiconductor device, in accordance with some embodiments of the present disclosure.

Reference is now made to FIG. 9A. FIG. 9A is a top-view of a schematic layout of a semiconductor device 900, in accordance with some embodiments of the present disclosure. With respect to the embodiments of FIG. 9A, like elements in FIG. 1 are designated with the same reference numbers for ease of understanding.

In some embodiments of FIG. 9A, compared with the semiconductor devices 100 in FIG. 1, the layouts of the area 120 and the area 130 are turned upside down. For illustration of FIG. 9A, the area 130 includes a recess 931. The recess 931 of the area 130 is disposed at a side of the 130, and faces a substantially flat surface the area 120. The recess 121 of the area 120 is disposed at a side of the area 120, and faces a direction opposite to the oxide layer 130. Accordingly, as described above, a side area 9310 facing the recess 931, on the side of the area 120, is substantially flat. As a result, compared to the approaches employing L-shaped PODE structures, the yield of manufacturing of the semiconductor device 900 is improved.

Figure 9B:
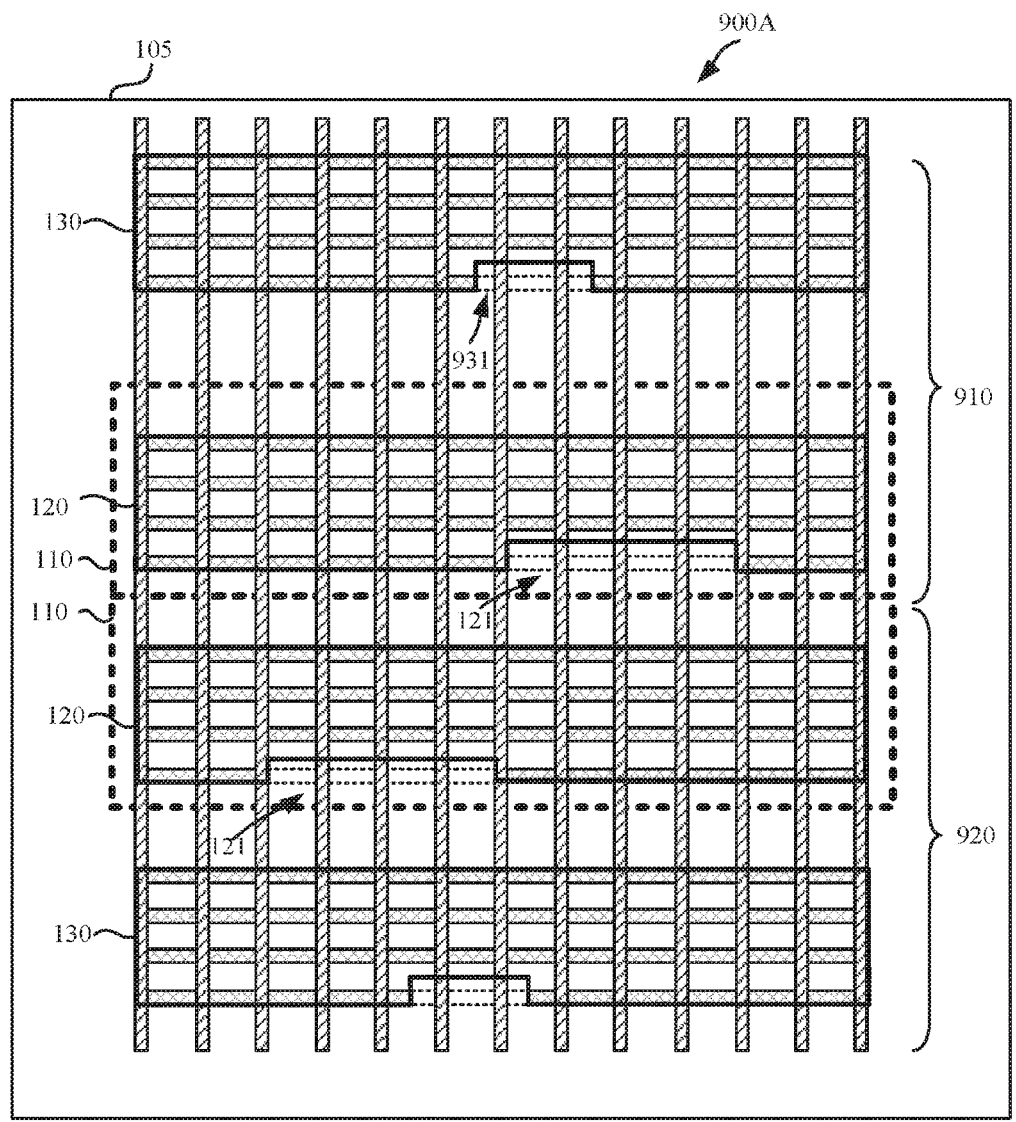
FIG. 9B is a top-view of a schematic layout of a semiconductor device, in accordance with some embodiments of the present disclosure.

Reference is now made to FIG. 9B. FIG. 9B is a top-view of a schematic layout of a semiconductor device 900A, in accordance with some embodiments of the present disclosure. With respect to the embodiments of FIGS. 1 and 9B, like elements in FIG. 1 are designated with the same reference numbers for ease of understanding.

In some embodiments, the semiconductor device 900A is formed through one or more semiconductor manufacturing equipments according to a first layout design and a second layout design. For example, the first layout design is the layout design 200 in FIG. 2, and the second layout design is the layout design corresponding to the semiconductor device 900 in FIG. 9A.

As illustratively shown in FIG. 9B, the semiconductor device 900A includes a portion 910 and a portion 920. The portion 910 is disposed adjacent to the portion 920. The arrangements of the portion 910 are the same as those of the semiconductor device 900 in FIG. 9A. The arrangements of the portion 920 are the same as those of the semiconductor device 100 in FIG. 1. Thus, the repetitious descriptions are not given herein.

For example, the layout pattern corresponding to the portion 910 is placed through the auto place and route (APR) tool according to a first cell library storing the layout design corresponding to the semiconductor device 900 in FIG. 9A. The layout patterns corresponding to the portion 920 are able to be placed through the auto place and route (APR) tool according to a second cell library storing the layout design 200 in FIG. 2. Effectively, in some embodiments, a number of the semiconductor devices 100 in FIG. 1 and the semiconductor devices 900 in FIG. 9A are arranged sequentially in a longitudinal direction.

Furthermore, as illustratively shown in FIG. 9B, the well 110 of the portion 910 is coupled and contacted with the well 110 of the portion 920. In some embodiments, a single well, including the wells 110 of the portions 910 and 920, is formed and shared with the portion 910 the portion 920.

The arrangements of forming a number of the semiconductor devices 100 in FIG. 1 are given for illustrative purposes only. Various arrangements of forming a number of the semiconductor devices 100 are within the contemplated scope of the present disclosure. For example, in some embodiments, by utilizing the auto place and route (APR) tool, a number of the semiconductor devices 700 in FIG. 7 are able to formed and aligned with each other in a horizontal direction. In some other embodiments, the layout design corresponding to the semiconductor device 800 in FIG. 8 is manually generated by a layout designer according the corresponding cell library. In some alternative embodiments, the layout design corresponding to the semiconductor device 900A in FIG. 9B is manually generated by a layout designer according the corresponding cell libraries.

The term "substantially" in the whole disclosure refers to the fact that embodiments having any tiny variation or modification not affecting the essence of the technical features can be included in the scope of the present disclosure.

In some embodiments, a semiconductor device is disclosed that includes a substrate and fins. The fins are formed on a first area and a second area of the substrate. The first area includes a first recess. The second area is located with respect to the first area. The first recess is disposed at a side of the first area, and faces the second area. A side area facing the first recess, on a side of the second area, is substantially flat.

Also disclosed is a device that includes first fins and second fins. The first fins are formed on a first area of a substrate, and at least two of the first fins are located at sides of a first recess of the first area respectively. The second fins are formed on a second area of the substrate. A first edge of the second area, which faces and corresponds to the first recess, is substantially flat.

Also disclosed is a method that includes the operation below. A first layout pattern corresponding to a first area of a substrate is placed. A second layout pattern corresponding to a second area of the substrate is placed, in which the first layout pattern is placed with respect to the second layout pattern. Third layout patterns corresponding to fins are placed over the first area and the second area. A fourth layout pattern corresponding to a dummy gate is placed at a recess portion of the first layout pattern and between the first layout pattern and the second layout pattern, to generate a layout design of a semiconductor device. A projection area of the recess portion of the first layout pattern on the second layout pattern is substantially flat, and the semiconductor device is fabricated by a tool based on the layout design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and a plurality of fins formed on a first area and a second area of the substrate, wherein the first area comprises a first recess; and
a plurality of gates each disposed across the first area and the second area, and arranged to intersect the plurality of fins, wherein at least one of the plurality of gates is disposed across the first recess;
wherein the first recess is disposed at a side of the first area, and faces the second area, and a side of the second area facing the first recess is substantially flat;
wherein the plurality of fins comprise:
first continuous fins on the first area, wherein the plurality of gates are arranged across each one of the first continuous fins; and
a second fin, on the first area, including separate portions that are spaced apart by the first recess, wherein in the plurality of gates arranged across the first continuous fins, a first number of gates arranged across the first continuous fins is equal to a sum of a second number of gates across the second fin and a third number of gates across the first recess.

2. The semiconductor device of claim 1, wherein the second area comprises a second recess at the side of the second area, and a first edge of the first recess is substantially aligned with a first edge of the second recess, and a second edge of the first recess is substantially aligned with a second edge of the second recess.

3. The semiconductor device of claim 2, wherein the first edge of the first recess is an edge of the first area.

4. The semiconductor device of claim 2, wherein the first edge of the second recess is an edge of the second area.

5. The semiconductor device of claim 1, wherein the first area further comprises a second recess, the second recess is disposed at the side of the first area, and faces the second area, and the side of the second area facing the second recess is substantially flat,
wherein a first distance is present between two adjacent gates of the gates, and a second distance between the first recess and the second recess is equal to or greater than twice of the first distance.

6. The semiconductor device of claim 1, wherein the second area further comprises a second recess, the second recess is disposed at the side of the second area and faces the first area, and the side of the first area facing the second recess is substantially flat,
wherein a first distance is present between two adjacent gates of the gates, and a second distance between the first recess and the second recess is equal to or greater than twice of the first distance.

7. The semiconductor device of claim 5, further comprising:
a well, wherein the first area is arranged within the well, and an edge of the well is substantially aligned with a first gate of the gates.

8. A semiconductor device, comprising:
a plurality of first fins formed on a first area of a substrate, wherein at least two of the first fins are located at sides of a first recess of the first area respectively;
a plurality of second fins formed on a second area of the substrate, wherein a first edge of the second area, which faces and corresponds to the first recess, is substantially flat; and
a plurality of gates each disposed across the first area and the second area, and arranged to intersect the first fins and the second fins, wherein at least one of the plurality of gates is disposed across the first recess,
wherein the plurality of first fins comprise:
first continuous fins, wherein the plurality of gates are arranged across each one of the first continuous fins,
wherein the at least one of the first fins are spaced apart by the first recess, wherein in the plurality of gates arranged across the first continuous fins, a first number of gates arranged across the first continuous fins is equal to a sum of a second number of gates across the at least one of the first fins and a third number of gates across the first recess.

9. The semiconductor device of claim 8, wherein at least two of the first fins are located at sides of a second recess of the first area respectively, and the first edge of the second area, which faces and corresponds to the second recess, is substantially flat,
wherein a first distance is present between two adjacent gates of the gates, and a second distance between the first recess and the second recess is equal to or greater than twice of the first distance.

10. The semiconductor device of claim 8, wherein at least two of the second fins are located at sides of a second recess of the second area respectively, and an edge of the first area, which faces and corresponds to the second recess, is substantially flat,
wherein a first distance is present between two adjacent gates of the gates, and a second distance between the first recess and the second recess is equal to or greater than twice of the first distance.

11. The semiconductor device of claim 8, further comprising:
a well formed on the substrate, wherein the first fins are formed on the well;
wherein an edge of the well is substantially aligned with a first gate of the gates.

12. The semiconductor device of claim 8, wherein at least two of the second fins are located at sides of a second recess of the second area respectively, and a first edge of the first recess is substantially aligned with a second edge of the second recess, a second edge of the first recess is substantially aligned with a third edge of the second recess, and the first edge of the second area is located between the second edge and the third edge of the second recess.

13. The semiconductor device of claim 12, wherein the first edge of the first recess is an edge of the first area.

14. The semiconductor device of claim 12, wherein the second edge of the second recess is an edge of the second area.

15. A semiconductor device, comprising:
a substrate;
a plurality of fins formed on a first area and a second area of the substrate, wherein the first area comprises a first recess that is disposed at a side of the first area, the second area comprises a second recess that is disposed at a side of the second area, and a first edge of the second area, which faces and corresponds to the first recess, is substantially flat; and
a plurality of gates disposed across the first area and the second area, and arranged to intersect the plurality of fins, wherein at least one of the plurality of gates is disposed across the first recess;
wherein the plurality of fins comprise:
first continuous fins on the first area, wherein the plurality of gates are arranged across each one of the first continuous fins; and
a second fin, on the first area, including separate portions that are spaced apart by the first recess, wherein a first length of each one of the first continuous fins is substantially equal to a sum of a second length of the second fin and a third length of the first recess.

16. The semiconductor device of claim 15, wherein the first area further comprises a third recess that is disposed at the side of the first area and faces the second area,
wherein a first distance is present between two adjacent gates of the gates, and a second distance between the first recess and the third recess of the first area is equal to or greater than a multiple of the first distance.

17. The semiconductor device of claim 15, wherein the second area further comprises a third recess that is disposed at another side of the second area and faces the first area,
wherein a first distance is present between two adjacent gates of the gates, and a second distance between the second recess and the third recess of the second area is equal to or greater than a multiple of the first distance.

18. The semiconductor device of claim 16, wherein the at least one of the gates is disposed across the first recess and the third recess.

19. The semiconductor device of claim 17, wherein the at least one of the gates is disposed across the first recess and the third recess.

20. The semiconductor device of claim 16, wherein the first edge of the second area, which faces and corresponds to the third recess, is substantially flat.

\* \* \* \* \*